United States Patent [19]

Ohike

[11] Patent Number: 5,174,238

[45] Date of Patent: Dec. 29, 1992

[54] POINTER SHAFT IN INDICATING INSTRUMENT

[75] Inventor: Yukio Ohike, Shizuoka, Japan

[73] Assignee: Yazaki Corporation, Tokyo, Japan

[21] Appl. No.: 775,421

[22] Filed: Oct. 15, 1991

[30] Foreign Application Priority Data

Oct. 22, 1990 [JP] Japan ............................ 2-109766[U]

[51] Int. Cl.$^5$ ............................................ G01D 13/22
[52] U.S. Cl. ................................... 116/328; 73/866.1; 116/332
[58] Field of Search ........ 116/328, DIG. 6, DIG. 36, 116/293, 332; 368/238; 73/431, 866.1

[56] References Cited

U.S. PATENT DOCUMENTS

| | | | |
|---|---|---|---|
| 892,021 | 6/1908 | Wirsching | 116/328 X |
| 1,840,039 | 1/1932 | Joyce | 116/328 X |
| 2,577,491 | 12/1951 | Teter | 116/293 |
| 3,855,787 | 12/1974 | Assmus | 368/238 |
| 4,127,928 | 12/1978 | Green | 368/238 X |
| 4,723,504 | 2/1988 | Griffin et al. | 116/DIG. 6 X |

Primary Examiner—Daniel M. Yasich
Attorney, Agent, or Firm—Sughrue, Mion, Zinn, Macpeak & Seas

[57] ABSTRACT

A pointer shaft in an indicating instrument comprises a movement for turning the pointer shaft according to an amount of measurement, a pointer having an engaging hole in a base end portion, an end portion of the pointer shaft is fixedly pushed into the engaging hole of the pointer, a dial for indicating the amount of measurement in cooperation with the pointer, and projection means for bitting an inner wall of said engaging hole to prevent the relative rotation of said pointer and said pointer shaft, said means formed on an outer cylindrical surface of said end portion of said pointer shaft.

6 Claims, 1 Drawing Sheet

POINTER SHAFT IN INDICATING INSTRUMENT

BACKGROUND OF THE INVENTION

This invention relates to the pointer shaft in an indicating instrument, and more particularly to the pointer shaft in an indicating instrument which comprises: a movement for turning the pointer shaft according to an amount of measurement; a pointer having an engaging hole in the base end portion, into which the end portion of the pointer shaft is fixedly pushed; a dial which is, for instance, graduated, for indicating the amount of measurement in cooperation with the pointer of the pointer shaft, and which is installed, for instance, on a motor vehicle and is suitable as an indicating instrument such as a speed meter, a tachometer or boost meter to be installed on a vehicle.

One example of a conventional indicating instrument of this type is a cross coil type indicating instrument which is designed as shown in FIG. 3. In the indicating instrument, current changing according to an amount of measurement is applied to a pair of coils to allow the latter to form magnetic fields perpendicular to each other, and a magnet rotor is rotated in the direction of the composite magnetic field which is formed by combining the magnetic fields of the two coils, to turn the pointer on the dial to indicate an amount of measurement. This will be described in more detail.

As shown in FIG. 3, a movement 1 for turning a pointer shaft 1a according to an amount of measurement has a coil bobbin 11, on which two coils 12a and 12b are wound in such a manner that they are perpendicular to each other. A disk-shaped magnetic rotor 13 with S and N poles is arranged in the space defined by the coil bobbin 11. The magnetic rotor 13 is fixedly mounted on a rotary shaft 14 of made metal. More specifically, the rotary shaft 14 penetrates the magnetic rotor 13 at the center in such a manner that it is perpendicular to the magnet rotor. The rotary shaft 14 is rotatably supported by the coil bobbin 11 in such a manner that one end portion of the rotary shaft 14 extends outside the coil bobbin 11, thus serving as the aforementioned pointer shaft 1a. When current is applied to the coils 12, the magnetic rotor 13 together with the pointer shaft 1a is turned through a predetermined angle in response to the applied current.

A spring ring 15 is fixedly mounted on the pointer shaft 1a. The inner end portion of a spiral hair spring 16 is secured to the outer cylindrical wall of the spring ring 15, and the outer end portion is secured to a frame 22. The hair spring 16 function as follows: That is, when the coils 12 are not energized and therefore the magnetic rotor is not turned, the pointer shaft 1a is returned to the "0" position and held there by the elastic force of the hair spring 16.

A dial 18 is mounted on the movement 1 with screws 19. The upper end portion of the pointer shaft 1a protrudes from the upper surface of the dial 8 such that a pointer 20 made of synthetic resin may be fixedly engaged. Specifically, the end portion of the, pointer shaft 1a is tapered so that it can be readily inserted into an engaging hole 20b formed in the base end portion 20a of the pointer 20.

A movement casing 21 is provided outside the coil bobbin 11 so as to isolate the inside and outside magnetic fields from each other.

In the above-described indicating instrument, the pointer 20 is fixedly mounted on the upper end portion of the pointer shaft 1a as follows: First, the pointer 20 is temporarily mounted on the upper end portion of the pointer shaft 1a. Under this condition, current corresponding to a predetermined amount of measurement is applied to the cross coils 12. For instance, in the case where the instrument is to be used as a speed meter, current corresponding to 40 km is applied to the cross coils 12. With the current supplied in this manner, the position of the pointer 20 temporarily mounted on the upper end portion of the pointer shaft is so adjusted that the pointer indicates the amount of measurement on the dial 18. Under this condition, the upper end portion of the pointer shaft 1a is pushed into the engaging hole 20b of the pointer 20. Then, the pointer 20 thus adjusted in position is fixedly mounted on the pointer shaft.

When a predetermined current is applied to the coils 12 according to predetermined measurement signal such as a vehicle speed, the coils 12 form magnetic fields. The magnetic fields thus formed are combined into a composite magnetic field. As a result, the magnetic rotor 13 and accordingly the pointer shaft 1a is turned according to the strength of the composite magnetic field; i.e., the amount of measurement. In other words, the pointer is turned to the position on the dial 18 which corresponds to the amount of measurement.

When the application of the current to the coils 12 is suspended, the magnetic rotor 13 is returned to the "0" position by the elastic force of the hair spring 16.

As was described above, in the conventional indicating instrument, the pointer 20 is secured to the end portion of the pointer shaft 1a as follows: First, current corresponding to a predetermined amount of measurement is applied to the cross coils 21. Under this condition, the position of the pointer is so adjusted that the pointer indicates the corresponding value on the dial 18, and then the pointer 20 is depressed so that the end portion of the pointer shaft 1a is pushed into the engaging hole 20b of the pointer. Hence, if the surface of the pointer shaft, or the inner wall of the engaging hole 20b has scratches, or the engaging hole 20b is distorted even slightly, then the pointer shaft 1a and the pointer 20 will turn relative to each other when the pointer is depressed so as to be fixedly mounted on the pointer shaft.

As a result, the position of the pointer 20 is no longer accurate. Therefore, the pointer 20 indicate the correct measurement value.

SUMMARY OF THE INVENTION

In view of the foregoing, an object of this invention is to provide a pointer shaft for an indicating instrument on which a pointer can be accurately and fixedly mounted, whereby the indicating instrument manufactured is accurate in indication characteristic.

In order to solve the above-described problem, in an indicating instrument comprising: a movement for turning a pointer shaft according to an amount of measurement; a pointer having an engaging hole in the base end portion, into which the end portion of the pointer shaft is fixedly inserted; a dial which is, for instance, graduated, for indicating the amount of measurement in cooperation with the point, the pointer is so improved according to the invention in that it has pairs of axially extending V-shaped protrusions formed on the end portion thereof.

Since the pointer shaft is designed as described above, when the end portion of the pointer shaft is inserted into the engaging hole of the pointer to secure the pointer to the pointer shaft, the sharp edges of the protrusions bite the inner wall of the engaging hole, thus preventing the relative rotation of the pointer and the pointer shaft. Hence, even if the outer surface of the pointer shaft or the inner wall of the engaging hole is not perfectly smooth, or the engaging hole is distorted slightly, the pointer shaft and the pointer will not turn relative to each other.

DETAILED DESCRIPTION OF THE PREFERRED EMBODIMENTS

One embodiment of this invention will be described with reference to the accompanying drawing.

Figure 1:
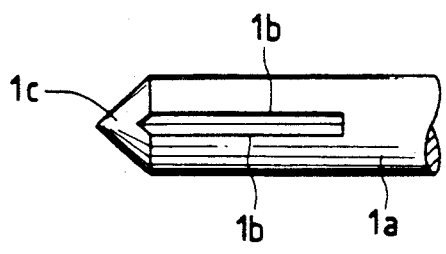
FIG. 1 is a side view of one example of a pointer shaft in an indicating instrument according to this invention.
Figure 2:
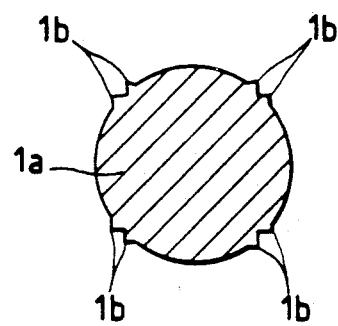
FIG. 2 is a cross sectional view of the pointer shaft shown in FIG. 1.

FIGS. 1 and 2 show one example of a pointer shaft for an indicating instrument according to the invention.

Figure 3:
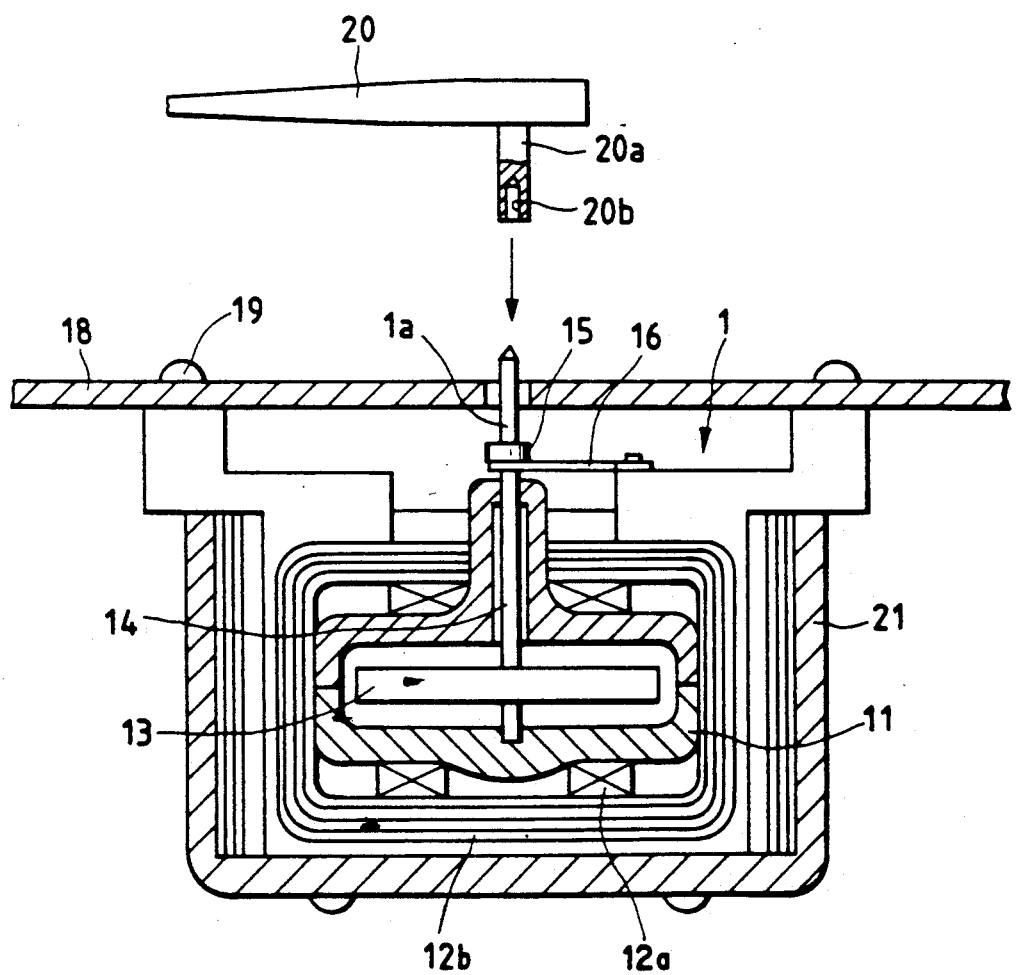
FIG. 3 is a vertical sectional view showing a conventional cross coil type indicating instrument.

The pointer shaft 1a is made of metal. As shown in FIGS. 1 and 3, the pointer shaft 1a has four pairs of V-shaped protrusions 1b on the outer cylindrical surface of its end portion. More specifically, the stripe-shaped protrusions 1b are arranged at substantially equal angular intervals and extended along the axis of the pointer shaft 1a. The two edge portions of each of the V-shaped protrusions 1b formed an (acute angle). The V-shaped protrusions 1b can be formed by a simple punching operation; that is, they can be readily formed by nicking the cylindrical surface of the pointer shaft. The end portion of the pointer shaft 1a is tapered as indicated at 1c, so that the pointer shaft 1a can be readily pushed into the engaging hole 20b formed in the pointer 20.

In securing the pointer 20 (FIG. 3) to the end portion of the pointer shaft 1a, the procedure for positioning the pointer 20 with respect to the pointer shaft 1a before the pointer shaft 1a is completely pushed into the engaging hole 20b of the pointer 20 is the same as that described with reference to FIG. 3.

However, it should be noted that, in the embodiment, a plurality of V-shaped protrusions 1b are formed on the end portion of the pointer shaft 1a in such a manner that they extend axially, and the edge portions of each of the V-shaped protrusion forms an acute in angle, as was described above. Hence, when the pointer 20 is depressed to push the end portion of the pointer shaft 1a into the engaging hole 20b of the pointer 20, the V-shaped protrusions 1b formed on the end portion of the pointer shaft 1a bite the inner wall of the engaging hole 20b. Thus, imperfections in the outer surface of the pointer shaft 1a or in the inner wall of the engaging hole 20b or the slight distortion of the engaging hole 20b can be disregarded in this engaging operation. That is, in the engaging operation, the pointer 20 and the pointer shaft 1a will not turn relative to each other. Hence, the pointer 20 can be fixedly engaged with the pointer shaft so as to point to the predetermined indication position; that is, a measurement value can be correctly indicated by the pointer 20. In the present invention, the number of the protrusions are not limited to this embodiment but at least one protrusion may be formed on the outer cylindrical surface of the end portion of the pointer shaft.

As was described above, according to the invention, when the end portion of the pointer shaft is pushed into the engaging hole of the pointer, the sharp edges of the V-shaped protrusions formed on the end portion bite the inner wall of the engaging hole so as to prevent the relative rotation of the pointer and the pointer shaft. Hence, even if the outer surface of the pointer shaft or the inner wall of the engaging hole are not perfectly smooth, or the engaging hole is slightly distorted, the relative rotation of the pointer and the pointer shaft will not take place. Therefore, the pointer shaft can be pushed into the pointer correctly and secured to it accurately in position. The pointer thus engaged is accurate in indication characteristic. With the pointer accurate in indication characteristic, an amount of measurement can be indicated with high accuracy.

What is claimed is:

1. An indicating instrument, comprising:
    a pointer shaft having at one end portion thereof at least one V-shaped protrusion provided on the outer surface thereof and extending axially along said one end portion of said shaft;
    a movement for turning said pointer shaft according to an amount of measurement;
    a pointer having an engaging hole in a base end portion for receiving and retaining said one end portion of said pointer shaft;
    a dial for indicating said amount of measurement in cooperation with said pointer, wherein during insertion of said shaft into said engaging hole said at least one protrusion bites into an inner wall of said engaging hole to prevent the relative rotation of said pointer and said pointer shaft.

2. The indicating instrument as claimed in claim 1, wherein said one end portion of said shaft includes a pair of v-shaped protrusions disposed immediately adjacent one another.

3. The indicating instrument as claimed in claim 1, wherein said V-shaped protrusion forms an acute angle.

4. The indicating instrument as claimed in claim 1, wherein said pointer shaft includes a plurality of V-shaped protrusions.

5. The indicating instrument as claimed in claim 4, wherein said V-shaped protrusions each form an acute angle.

6. A pointer shaft in an indicating instrument as claimed in claim 4, wherein said V-shaped protrusions are arranged at substantially equal angular intervals.

* * * * *